(12) United States Patent
Grote et al.

(10) Patent No.: US 12,355,230 B2
(45) Date of Patent: Jul. 8, 2025

(54) RESIDUAL CURRENT MONITORING FOR A DC VOLTAGE SWITCHING DEVICE

(71) Applicant: Phoenix Contact GmbH & Co. KG, Blomberg (DE)

(72) Inventors: Tobias Grote, Lüdge (DE); Lutz Heuer, Blomberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 18/576,685

(22) PCT Filed: Jul. 3, 2022

(86) PCT No.: PCT/EP2022/068359
§ 371 (c)(1),
(2) Date: Jan. 4, 2024

(87) PCT Pub. No.: WO2023/280730
PCT Pub. Date: Jan. 12, 2023

(65) Prior Publication Data
US 2024/0266819 A1    Aug. 8, 2024

(30) Foreign Application Priority Data
Jul. 5, 2021  (BE) .................................. 2021/5520

(51) Int. Cl.
*H02H 3/10*  (2006.01)
*G01R 15/20*  (2006.01)
*G01R 19/10*  (2006.01)

(52) U.S. Cl.
CPC ............. *H02H 3/10* (2013.01); *G01R 15/202* (2013.01); *G01R 19/10* (2013.01)

(58) Field of Classification Search
CPC ............ H02H 3/10; H02H 7/268; H02H 3/33; H02H 3/087; G01R 15/202; G01R 19/10
See application file for complete search history.

(56) References Cited

U.S. PATENT DOCUMENTS

| 4,739,275 A | 4/1988 | Kimball et al. |
| 6,424,018 B1 * | 7/2002 | Ohtsuka ................. G01R 33/07 |
| | | 257/E27.005 |

(Continued)

FOREIGN PATENT DOCUMENTS

| CN | 103941141 | 7/2014 |
| CN | 204359847 U | 5/2015 |

(Continued)

OTHER PUBLICATIONS

Authorized Officer: Lindquist, Jim, International Preliminary Report on Patentability issued in PCT Application No. PCT/EP2022/068359 with machine translation, along with response to Written Opinion with English translation, Sep. 25, 2023, 48 pp.

(Continued)

*Primary Examiner* — Jared Fureman
*Assistant Examiner* — Nicolas Bellido
(74) *Attorney, Agent, or Firm* — Kaplan Breyer Schwarz, LLP

(57) ABSTRACT

A method for fault current monitoring during electrical coupling of a direct voltage load to a direct voltage source, includes detecting a magnetic field formed around positive and negative conductors; comparing the detected magnetic field to a threshold value; and disconnecting the direct voltage load if the threshold value is passed. Further, a direct voltage switching device for coupling a direct voltage load to a direct voltage source where positive and negative conductors are routed through the direct voltage switching device, includes a switching element for coupling and decoupling the direct voltage load, a sensor for detecting a magnetic field formed around the positive and negative conductors; and an evaluation device, connected to the sensor and the switching element, for comparing the detected magnetic field with a threshold value and to acti- (Continued)

Fig. 1 vate the switching element to disconnect the direct voltage load when the threshold value is passed.

13 Claims, 3 Drawing Sheets

(56) References Cited

U.S. PATENT DOCUMENTS

| | | | | |
|---|---|---|---|---|
| 10,725,100 | B2* | 7/2020 | Milano | G01R 33/0035 |
| 11,293,995 | B2* | 4/2022 | Essawy | G01R 31/52 |
| 11,402,409 | B1* | 8/2022 | McNally | G01R 15/207 |
| 12,051,894 | B2* | 7/2024 | Beckert | H02H 3/066 |
| 12,081,012 | B2* | 9/2024 | Grote | H02H 3/087 |
| 2006/0072270 | A1 | 4/2006 | Mladenik et al. | |
| 2014/0268434 | A1 | 9/2014 | Simonin | |
| 2018/0076612 | A1* | 3/2018 | Lavertu | H02H 3/10 |
| 2021/0013709 | A1* | 1/2021 | Kang | H02H 7/26 |
| 2021/0293895 | A1* | 9/2021 | Essawy | G01R 31/52 |
| 2022/0137103 | A1* | 5/2022 | Briano | G01R 19/15 |
| | | | | 324/76.77 |
| 2022/0149610 | A1* | 5/2022 | Beckert | H02H 3/066 |
| 2024/0266820 | A1* | 8/2024 | Grote | H02H 7/268 |

FOREIGN PATENT DOCUMENTS

| | | |
|---|---|---|
| CN | 104880987 | 9/2015 |
| CN | 110783883 | 2/2020 |
| DE | 102019203983 A1 | 9/2020 |
| DE | 102019203977 B4 | 12/2020 |
| EP | 2963753 A1 | 1/2016 |
| EP | 3723220 A1 | 10/2020 |
| EP | 3723223 A1 | 10/2020 |
| EP | 3723224 A1 | 10/2020 |
| GB | 1334169 A | 10/1973 |
| WO | 00/55826 A1 | 9/2000 |
| WO | 2008/022404 A1 | 2/2008 |
| WO | 2018/172134 A1 | 9/2018 |

OTHER PUBLICATIONS

Authorized Officer: Lindquist, Jim, International Search Report issued in PCT Application No. PCT/EP2022/068359, Nov. 4, 2022, 2 pp.
Search Report issued in Belgian Patent Application No. BE2021/5520, Apr. 11, 2022, 10 pp.
Office Action and English Translation thereof issued on Mar. 31, 2024 in Chinese Patent Application No. 202280048222.3.

* cited by examiner

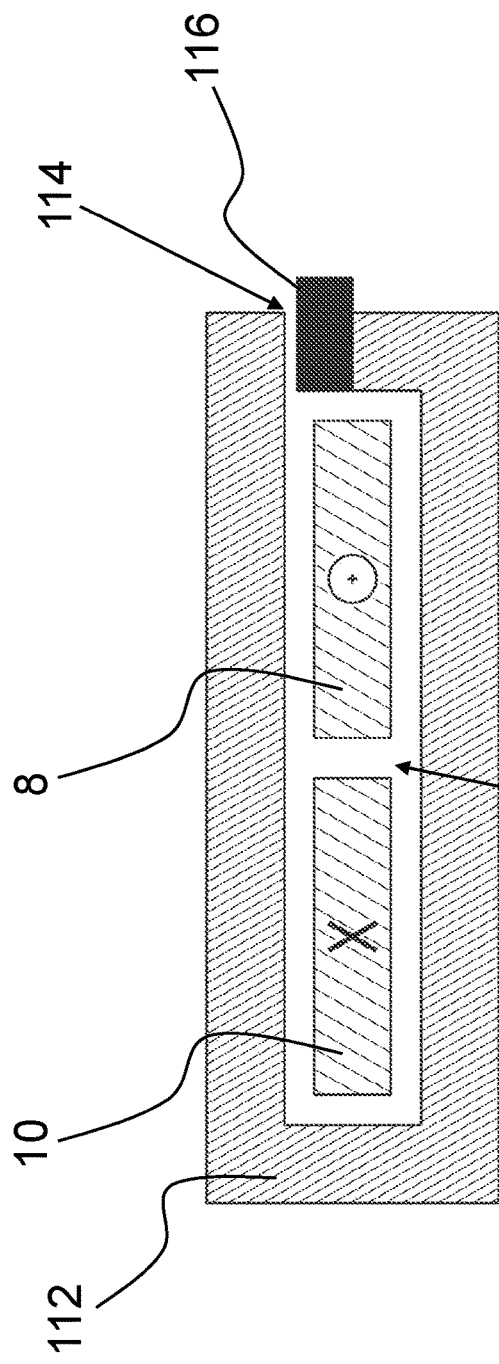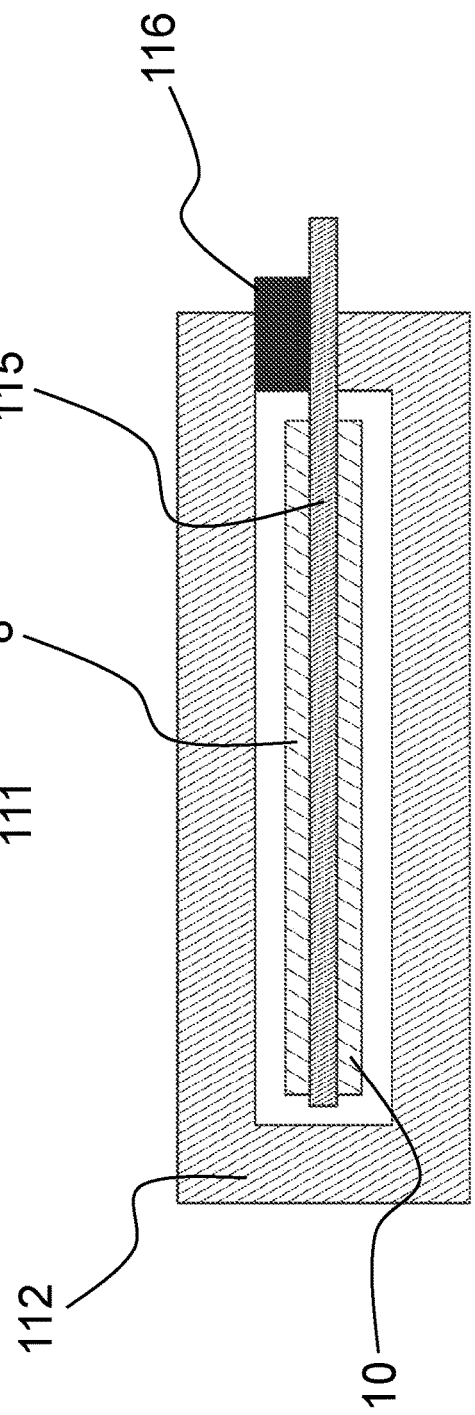

RESIDUAL CURRENT MONITORING FOR A DC VOLTAGE SWITCHING DEVICE

FIELD

The invention relates to fault current monitoring for a direct voltage switching device, in particular a method for fault current monitoring during electrical coupling of a direct voltage load via a positive conductor and negative conductor to a direct voltage source, a direct voltage switching device for coupling a direct voltage load via a positive conductor and negative conductor to a direct voltage source and a switching system with at least one such direct voltage switching device.

BACKGROUND

It is generally known from the state of the art to use direct voltage switching devices for the electrical coupling of direct voltage loads to direct voltage sources. In this case, both a positive conductor and a negative conductor, via which the direct voltage load is coupled to the direct voltage source, can be routed through the direct voltage switching device. In the context of the invention, the direct voltage load does not have to be a single load, but can also be composed of a group of direct voltage loads or be designed as a direct current network with a large number of direct voltage loads operated via it. Such direct voltage switching devices for electrically coupling direct voltage loads to direct voltage sources are becoming increasingly important, especially at factory level and/or in the implementation of intelligent networks, as a higher-level energy management system for the economic and energy optimization of the electrically coupled direct current network can be easily integrated and predefined current-voltage characteristics in the direct voltage devices contained as a result can ensure the immediate balancing of power demand and power supply. In addition, many components that are required with alternating current can be omitted with direct current. The advantages of a direct current supply (DC supply) for industrial systems are therefore obvious. In the context of the invention, a direct voltage load that can be electrically coupled to a direct voltage source can therefore in particular also form a logical unit and/or have components with strong functional dependencies on each other and/or contain intermediate circuit capacitances in order to keep switching-frequency equalization processes between individual devices away from the direct voltage source or the DC supply, and/or be electrically coupled to the direct voltage source or the DC supply via a direct voltage switching device.

If a fault current flows in a direct current circuit, i.e. in particular a current that flows via a given fault location due to an insulation fault, the direct current circuit must generally be switched off for safety reasons when a certain threshold value is reached. Furthermore, particularly in the case of network forms in which the earth potential is not isolated from the active conductors (e.g. TN-network), the fault location must be isolated from the rest of the network in the event of an earth fault. With sufficient low impedance, an earth fault can lead to an earth fault current, for example, which causes an upstream fuse to respond. With a high-resistance earth fault, on the other hand, the earth fault current is often too low for the fuse to operate. Such earth currents as a type of fault current are particularly dangerous, as they can lead to electrical accidents or system fires.

Various methods and devices for fault current monitoring when electrically coupling a direct voltage load to a direct voltage source are known from the state of the art, with reference being made to DE 10 2019 203 983 A1, DE 10 2019 203 977 B4, EP 3 723 220 A1, EP 3 723 224 A1, WO 2008/022404 A1 and WO 2018/172134 A1 as examples.

SUMMARY

It is an object of the invention to create compared to the prior art a new, in particular also an improved type of fault current monitoring system for the electrical coupling of a direct voltage load via a positive conductor and negative conductor to a direct voltage source, which manages with a small number of components.

The solution according to the invention is provided by a method, a direct voltage switching device and a switching system with the features according to the appended claims 1, 3 and 9 respectively.

Accordingly, a method is proposed for fault current monitoring when electrically coupling a direct voltage load via a positive conductor and negative conductor to a direct voltage source, in which a magnetic field forming in total around the positive conductor and negative conductor is detected and then compared with a threshold value, whereby the direct voltage load is disconnected if the threshold value is passed.

In particular, a direct voltage switching device for coupling a direct voltage load via a positive conductor and negative conductor to a direct voltage source is thus also proposed, wherein the positive and negative conductors are routed through the direct voltage switching device and which has a switching element for coupling and decoupling the direct voltage load, a sensor and an evaluation device connected to the sensor and the switching element, wherein the sensor, in particular a Hall effect sensor, is set up to detect a magnetic field which is formed in total around the positive conductor and negative conductor, and evaluation device for comparing the detected magnetic field with respect to a threshold value and for activating the switching element for decoupling the direct voltage load when the threshold value is passed.

It should be noted that passing the threshold value in the context of the invention expediently comprises exceeding it in the positive direction and falling below it in the negative direction.

Consequently, a significant advantage of the invention is that only a single sensor is required to detect a fault current in relation to the positive and negative conductors, because if there is no fault current, in particular current flow to earth potential, then the amounts of the currents in the positive and negative conductors are essentially the same and the magnetic field that forms around the positive and negative conductors as a whole is essentially zero. Furthermore, tolerable current changes, fluctuations and/or losses during operation of the direct voltage load can also be taken into account by comparison with a threshold value.

Such a direct voltage switching device can also be used in particular to implement a switching system in which the positive conductor and the negative conductor are connected at an input of the direct voltage switching device to a rectified three-phase AC network or to a direct voltage bus as a direct voltage source and a direct voltage branch with the direct voltage load can be connected and disconnected at an output of the direct voltage switching device via the positive conductor and the negative conductor.

Further useful embodiments are the subject of the appended, dependent claims.

BRIEF DESCRIPTION OF THE DRAWINGS

The invention is described in more detail below with reference to the accompanying drawings with reference to preferred embodiments, from which further features and advantages of the invention are shown. In the drawings show.

DETAILED DESCRIPTION

The invention is described in more detail below with reference to the accompanying drawings based on preferred exemplary embodiments.

Figure 1:
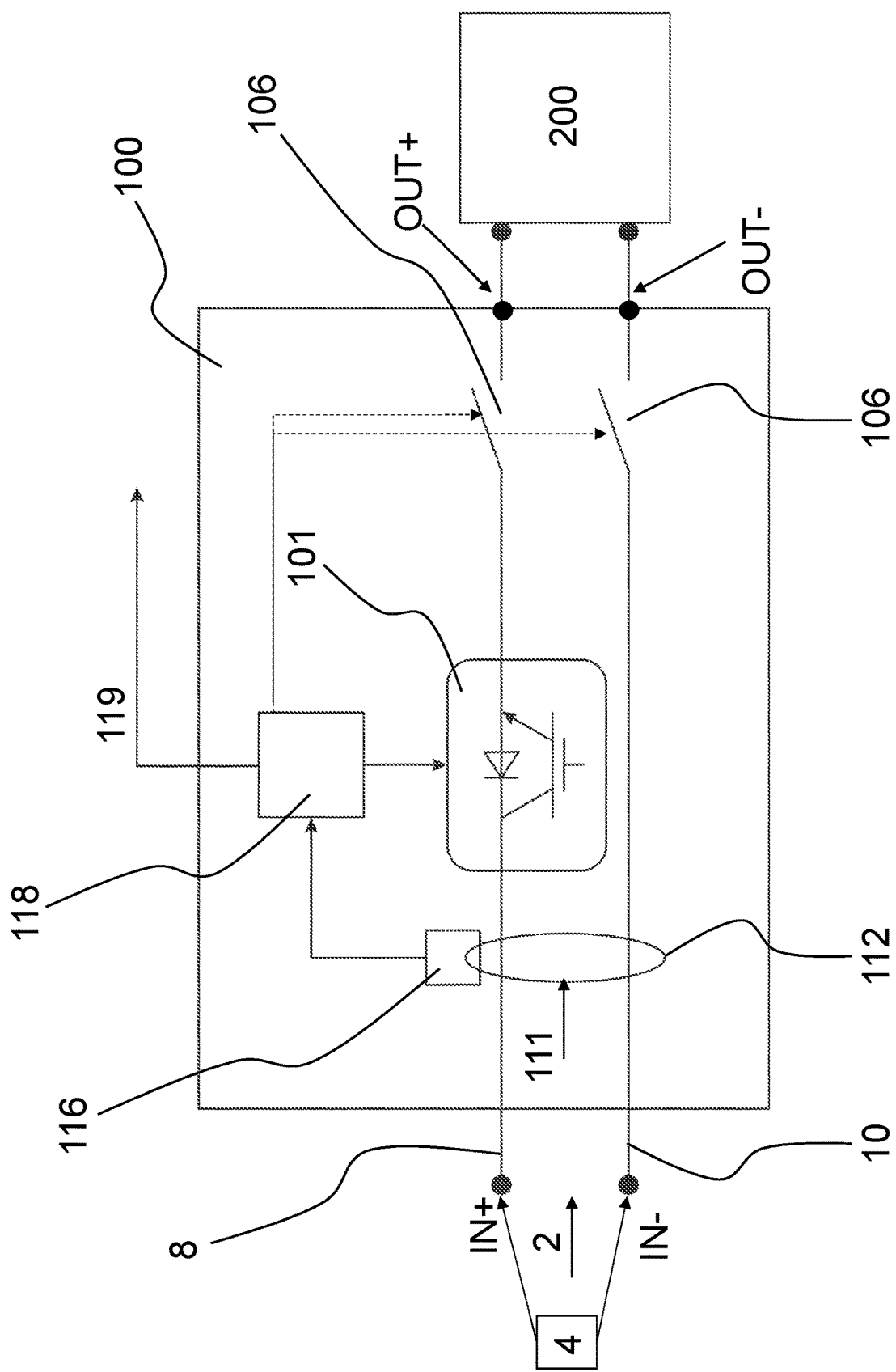
FIG. 1 a highly simplified first preferred embodiment of a direct voltage switching device according to the invention, FIG. 2 a highly simplified DC bus with positive and negative conductors as a direct voltage source with two DC branches, which can be coupled to the DC bus by means of direct voltage switching devices according to the invention, FIG. 3a highly simplified positive and negative conductors enclosed by a ferrite core with a sensor arranged in an air gap of the ferrite core, and FIG. 3b highly simplified positive and negative conductors arranged on a printed circuit board, whereby the printed circuit board is enclosed by a ferrite core and a sensor is arranged in an air gap of the ferrite core.

FIG. 1 shows, in highly simplified form, a preferred embodiment of a direct voltage switching device according to the invention, by means of which a method for fault current monitoring during electrical coupling of a direct voltage load 200 via a positive conductor 8 and negative conductor 10 to a direct voltage source 4 can be implemented in an expedient manner, in which a magnetic field forming overall around the positive conductor and negative conductor is detected, the detected magnetic field can then be compared with a threshold value and the direct voltage load 200 can be disconnected if the threshold value is passed.

In detail, FIG. 1 shows a direct voltage switching device 100, which is set up to couple a direct voltage load 200 to a direct voltage source 4 via a positive conductor 8 and a negative conductor 10. By means of the direct voltage switching device 100, a direct voltage branch 2 is set up, so as to speak, between the direct voltage source 4 and the direct voltage load 200. The positive conductor 8 and the negative conductor 10 are routed through the direct voltage switching device 100. The direct voltage switching device 100 comprises, i.e. includes, a switching element, i.e. at least one switching element 101 for coupling and decoupling the direct voltage load 200. This switching element 101 is in particular a semiconductor-based, electronically controllable switching element, which is expediently also required for operational switching in one of the current conductors, i.e. positive or negative conductor. In the embodiment shown, this switching element 101 is integrated into the positive conductor 8 for coupling and decoupling the direct voltage load 200. In the case of a semiconductor-based, electronically controllable switching element, this can alternatively also be constructed in an anti-serial arrangement, i.e. in particular as a bidirectional switch, so that operation of the direct voltage load, i.e. the current flow required for this with corresponding connection to the direct voltage source, is basically possible bidirectionally and respective one of the antiserially switched diodes of the semiconductor element can ensure the limitation of a respective current flow in one direction or the other. In principle, a further semiconductor switching element can of course also be integrated in the other conductor, i.e. also in the negative conductor as shown in FIG. 1.

Furthermore, the direct voltage switching device 100 comprises a sensor 116, which is set up to detect a magnetic field that is formed overall around the positive conductor 8 and negative conductor 10. Finally, an evaluation device 118 of the direct voltage switching device 100 connected to the sensor 116 and the switching element, i.e. expediently at least to the switching element 101, is set up to compare the detected magnetic field, i.e. in practical implementation the magnetic field detected in terms of value, with a threshold value and to activate the switching element accordingly, i.e. in particular the switching element 101 shown according to FIG. 1 for disconnecting the direct voltage load when the threshold value is passed. Since this is a semiconductor-based switching element according to the illustrated design, the direct voltage load 200 is subsequently at least electrically decoupled and can no longer be operated via the direct voltage source 4.

The fault current monitoring according to the invention is thus carried out by detecting a differential current or sum current across both conductors, whereby the magnetic field forming in total around the positive conductor 8 and negative conductor 10 is detected for this purpose. The term "difference", as used in the context of the present description and the claims, is to be understood as the difference in amount.

Consequently, a Hall effect sensor in particular can be used as sensor 116 to detect the magnetic field.

According to a particularly preferred embodiment, especially for an easy-to-implement detection of the overall magnetic field forming around these conductors, the positive conductor 8 and the negative conductor 10 are guided through a common through-opening 111 of a ferrite core 112, as sketched in FIG. 1. The ferrite core, which is thus appropriately surrounded by the direct voltage switching device for this purpose, is also preferably separated at one point and consequently forms an air gap 114 there, with the sensor 116 being arranged at this separated point, i.e. in particular in the air gap 114. With the aid of such a ferrite core, the magnetic field lines can thus be appropriately bundled and guided.

The FIGS. 3a and 3b show two possible practical embodiments in a highly simplified form, in which the positive and negative conductors 8, 10 are enclosed by a ferrite core 112 and the sensor 116 is arranged in an air gap 114 of the ferrite core. In FIG. 3b, the positive and negative conductors 8, 10 are arranged on a printed circuit board 115, i.e. in particular in the form of conductor tracks, and the printed circuit board 115 is guided through the through-opening 111 of the ferrite core 112 or enclosed by the ferrite core 112. When a printed circuit board 115 is used, the sensor 116 can also be placed on the latter in the same way, and expediently so that it is in turn arranged in the air gap. According to FIG. 3b, the air gap can also be completely filled by the sensor or, as shown, also by the printed circuit board 115 and the sensor placed on it.

If there is no fault current, i.e. in particular no current flow to earth potential in the direct voltage branch, then the amounts of the currents in the positive conductor and negative conductor are equal in the optimum case, i.e. the sum of the currents is zero or the difference in amount is zero. Consequently, the sensor 116 is preferably arranged to detect no magnetic field or to detect a magnetic field with the value zero if the electrical current in the positive conductor 8 and negative conductor 10 is equal in amount. If there is a fault current in the direct voltage branch, then the amounts of the currents in the positive conductor 8 and negative conductor 10 are no longer equal and a magnetic field not equal to zero can consequently be detected. The magnetic field detected can therefore also assume a value greater than or less than zero depending on the magnitudes of the currents in the positive conductor 8 and negative conductor 10 and depending on the respective current direction. As a result of the detection of the overall current flow according to the invention by means of detection of an overall magnetic field forming around the positive and negative conductors, however, the use of only a single sensor is thus necessary for the detection of a fault current in the direct voltage branch 2 including the direct voltage load 200 electrically connected thereto.

The evaluation device 118 can have an analog circuit, a discrete circuit or preferably also a μC (microcontroller) for evaluating the detected magnetic field, i.e. in particular for comparing the detected magnetic field with respect to a threshold value and for activating the at least one switching element 101. If the differential or total current exceeds or falls below a threshold value, in particular a predetermined threshold value, depending on the design and/or area of application, the switching element, i.e. in particular the switching element 101 shown in FIG. 1, for decoupling the load 200 from the source 4 is activated accordingly, i.e. in particular switched off. However, the switching element for coupling and decoupling the direct voltage load 200 can additionally or alternatively also comprise a second and a third switching element 106, in particular a second and third electromechanical switching element, one of the second and third switching elements 106 being integrated in the positive conductor 8 and the other in the negative conductor 10. In this way, galvanic decoupling of the load 200 from the source 4 can also be achieved, in particular equally by means of the evaluation device 118. For this purpose, the second and third switching elements 106 can therefore have relay contacts. According to a preferred embodiment, however, at least one first switching element 101, which is set up in particular as a semiconductor-based, electronically controllable switching element, is integrated in the positive conductor 8 or in the negative conductor 10.

Consequently, if the value of the magnetic field detected around both conductors as a whole, and thus in particular the differential current or sum current of both conductors, for example, passes a predetermined critical value, the first switching element 101 and/or the second and third switching element 106 can be switched off by the evaluation device 118 depending on the value passed through and the special design, thus electrically or galvanically decoupling the direct voltage branch from the direct voltage source 4. Furthermore, the current flow in both directions is prevented by switching off the second and third switching element 106, whereas when the first switching element 101 shown in FIG. 1 is switched off, the current flow is initially only prevented in one of the conductors, unless another semiconductor switching element is also integrated in the respective other conductor, i.e. also in the negative conductor according to FIG. 1. The second and third switching elements 106 thus safely isolate the DC output from the DC input.

The evaluation device 118 furthermore has, in an expedient further development, a message output or a communication interface, namely for outputting 119 a message signal if the threshold value is passed and/or if the threshold value is not passed but the detected magnetic field has a value that is greater in amount than a second threshold value that is smaller in amount than the threshold value. In this way, tolerable current changes, fluctuations and/or losses during operation of the direct voltage load can also be taken into account in a versatile and flexible manner via the comparison with a threshold value.

Furthermore, the evaluation device 118 is not only designed and set up to electrically and/or galvanically decouple the direct voltage load 200 or the entire direct voltage branch 2 from the direct voltage source 4 by means of corresponding activation commands to the switching element or the switching elements, i.e. to switch it or them off, but also to electrically and/or galvanically couple the direct voltage load 200 or the entire direct voltage branch 2 to the direct voltage source 4 by means of corresponding activation commands to the switching element or the switching elements, i.e. to cause it or them to be switched on. In particular, a command to the evaluation device 118 for effecting the switch-on based on this can, according to an appropriate embodiment, also be received by the evaluation device 118, for example via a communication interface as described above or via another input interface, in particular a digital input.

Consequently, a direct voltage switching device as described above in various embodiments can also be used to implement a switching system, in which the positive conductor 8 and the negative conductor 10 are connected to the direct voltage source 4 at an input IN+, IN− of the direct voltage switching device 100, e.g. also to a direct voltage bus as the direct voltage source 4, and a direct voltage branch can be connected to and disconnected from the direct voltage load 200 at an output OUT+, OUT− of the direct voltage switching device 100 via the positive conductor 8 and the negative conductor 10 (see FIG. 1).

Figure 2:
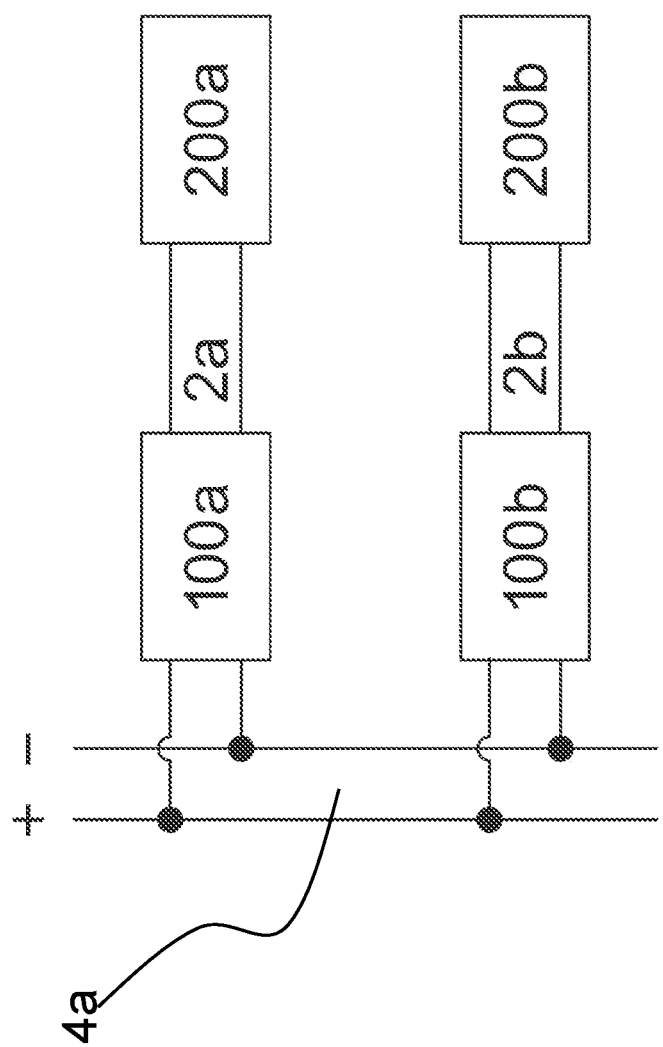

Based on this, FIG. 2 shows a highly simplified sketch of a preferred switching system, which has a first such direct voltage switching device 100*a* with an input and an output, whereby the positive conductor and the negative conductor 10 input are connected to a direct voltage bus 4*a* as a direct voltage source and a direct voltage branch 2*a* with a direct voltage load 200*a* can be connected and disconnected at the output via the positive conductor and the negative conductor.

In an expedient further development according to FIG. 2, at least one further such direct voltage switching device 100*b* with an input and an output is also included, whereby in this further direct voltage switching device 100*b* the positive conductor 8 and the negative conductor 10 are also connected to the direct voltage bus 4*a* at the input and a further direct voltage branch 2*b* with a direct voltage load 200*b* can be connected and disconnected at the output via the positive conductor 8 and the negative conductor 10.

In view of the above description, the direct voltage load does not have to be a single load, but can be made up of a group of direct voltage loads or be designed as a direct current network with a large number of direct voltage loads operated via it.

In practical implementation, a MOSFET ("metal-oxide-semiconductor field-effect transistor") or IGBT ("insulated gate bipolar transistor"), for example, is suitable for rapid decoupling of the direct voltage load or the direct voltage branch from the direct voltage source, in particular a direct voltage bus, for the semiconductor-based, electronically controllable switching element 101.

By means of the evaluation device 118 described above, it is therefore possible, depending on the application and/or the specific design, in particular to realize a charging current limitation of connected direct voltage loads, i.e. a precharging of DC link capacitors of the connected loads to the input voltage level, monitoring of various status variables, such as the input voltage, the output voltage, the load current and leakage currents to PE (residual current), a switch-off in the event of an error, i.e. as soon as a state variable leaves the permissible range.

a residual current switch-off, i.e. a switch-off if the difference between the currents in the positive and negative conductors becomes too great, and/or rapid shutdown in the event of a short circuit on the output side.

LIST OF REFERENCE SYMBOLS 2, 2a, 2b Direct voltage branch
4 Direct voltage source
4a Direct voltage bus
8 Positive conductor
10 Negative conductor
100, 100a, 100b Direct voltage switching device
101 first switching element
106 Second, third switching element
111 Access opening
112 Magnetic core
114 Air gap
115 PCB
116 Sensor
118 Evaluation device
119 Output of message output or communication interface
200, 200a, 200b Direct voltage load

The invention claimed is:

1. A method for fault current monitoring when electrically coupling a direct voltage load via a direct voltage branch that comprises a positive conductor and negative conductor to a direct voltage source, the method comprising:
using only a single sensor for a detection of a fault current in the direct voltage branch by:
detecting a magnetic field by the single sensor, wherein the magnetic field is formed overall around the positive conductor and negative conductor for detecting a differential current across positive and negative conductors and in terms of amount, wherein a magnetic field of substantially zero value is detected when there is no fault current and a non-zero magnetic field is detected when there is a fault current,
comparing the detected magnetic field with respect to a threshold value; and
as soon as the fault current to be monitored leaves a permissible range in such a way that the differential current in terms of amount in positive conductor and negative conductor passes a predetermined value and the detected magnetic field accordingly passes the threshold value, activating a switching element for disconnecting the direct voltage load.

2. The method according to claim 1, wherein the positive conductor and negative conductor are guided through a common through-opening of a ferrite core which is separated at one point and provided there with the single sensor.

3. The method according to claim 2, wherein a Hall effect sensor is used as the single sensor.

4. A direct voltage switching device for coupling a direct voltage load via a direct voltage branch that comprises a positive and negative conductor to a direct voltage source, the positive conductor and the negative conductor being routed through the direct voltage switching device, comprising
a switching element for coupling and decoupling the direct voltage load;
only one single sensor for detecting a fault current in the direct voltage branch, wherein the single sensor is set up for detecting a magnetic field which forms overall around the positive conductor and negative conductor for detecting a differential current across positive and negative conductors and in terms of amount, wherein the magnetic field having the value of substantially being zero when there is no fault current and the magnetic field being of non-zero when there is a fault current; and
an evaluation device connected to the single sensor and the switching element, which is set up to compare the detected magnetic field with a threshold value and to activate the switching element to disconnect the direct voltage load as soon as the fault current leaves a permissible range in such a way that the differential current in terms of amount in positive conductor and negative conductor passes a predetermined value and the detected magnetic field accordingly passes the threshold value.

5. The direct voltage switching device according to claim 4,
wherein the single sensor is arranged not to detect a magnetic field when the differential current across the positive conductor and negative conductor is zero in amount,
and/or
wherein the direct voltage switching device further comprises a ferrite core which has a through-opening and is separated at one point to form an air gap, the positive conductor and the negative conductor being guided through the through-opening and the single sensor being arranged in the air gap.

6. The direct voltage switching device according to claim 4, wherein the switching element for coupling and decoupling the direct voltage load comprises a first switching element integrated in the positive conductor or in the negative conductor.

7. The direct voltage switching device according to claim 6, wherein the first switching element is a semiconductor-based, electronically controllable switching element.

8. The direct voltage switching device according to claim 4, wherein the switching element for coupling and decoupling the direct voltage load comprises a second and a third switching element, wherein one of the second and third switching element is integrated in the positive conductor and the other is integrated in the negative conductor.

9. The direct voltage switching device according to claim 8, wherein the second and third switching element each comprises an electromechanical switching element.

10. The direct voltage switching device according to claim 4, wherein the positive conductor and the negative conductor are designed as conductor tracks on a circuit board.

11. The direct voltage switching device according to claim 4, wherein the evaluation device has a message output or a communication interface for outputting a message signal if the threshold value is passed and/or if the threshold value is not passed but the detected magnetic field has a value which is greater in amount than a second threshold value which is smaller in amount than the threshold value.

12. A switching system with the direct voltage switching device according to claim 4, wherein the direct voltage switching device has an input and an output, wherein the positive conductor and the negative conductor are connected at the input to a direct voltage bus as a direct voltage source and a direct voltage branch can be connected to and disconnected from the direct voltage load at the output via the positive conductor and the negative conductor.

13. The direct voltage switching device according to claim 4, wherein the single sensor is a Hall effect sensor.

* * * * *